(12) United States Patent
Akhtar et al.

(10) Patent No.: US 8,010,851 B2
(45) Date of Patent: *Aug. 30, 2011

(54) TESTING MODULE, TESTING APPARATUS AND TESTING METHOD

(75) Inventors: Sami Akhtar, Tokyo (JP); Kiyoshi Murata, Tokyo (JP); Tomoyuki Sugaya, Tokyo (JP)

(73) Assignee: Advantest Corporation, Tokyo (JP)

( * ) Notice: Subject to any disclaimer, the term of this patent is extended or adjusted under 35 U.S.C. 154(b) by 529 days.

This patent is subject to a terminal disclaimer.

(21) Appl. No.: 12/058,757

(22) Filed: Mar. 31, 2008

(65) Prior Publication Data

US 2009/0249137 A1    Oct. 1, 2009

(51) Int. Cl.
*G11C 29/00* (2006.01)

(52) U.S. Cl. .................... 714/718; 714/735; 714/738

(58) Field of Classification Search .................. None
See application file for complete search history.

(56) References Cited

U.S. PATENT DOCUMENTS

| | | | | |
|---|---|---|---|---|
| 6,021,515 | A * | 2/2000 | Shimura | 714/738 |
| 6,161,206 | A * | 12/2000 | Wasson | 714/738 |
| 6,484,282 | B1 * | 11/2002 | Tsuto | 714/738 |
| 6,629,282 | B1 * | 9/2003 | Sugamori et al. | 714/734 |
| 6,917,215 | B2 * | 7/2005 | Ichikawa | 324/750.3 |
| 2002/0099993 | A1 * | 7/2002 | Ikeda | 714/738 |
| 2002/0186035 | A1 * | 12/2002 | Inoshita et al. | 324/765 |
| 2005/0149803 | A1 * | 7/2005 | Hirano et al. | 714/738 |
| 2005/0278598 | A1 * | 12/2005 | Yatsuka | 714/742 |
| 2005/0283697 | A1 * | 12/2005 | Kang et al. | 714/742 |
| 2006/0005095 | A1 * | 1/2006 | Ichikawa | 714/738 |
| 2006/0010360 | A1 * | 1/2006 | Kojima | 714/738 |
| 2006/0015788 | A1 * | 1/2006 | Yamazaki et al. | 714/738 |
| 2006/0026482 | A1 * | 2/2006 | Fujisaki | 714/742 |
| 2006/0031725 | A1 * | 2/2006 | Kang | 714/718 |
| 2006/0031732 | A1 * | 2/2006 | Ishida et al. | 714/738 |
| 2006/0107134 | A1 * | 5/2006 | Park et al. | 714/718 |
| 2006/0150046 | A1 * | 7/2006 | Ong | 714/738 |

(Continued)

FOREIGN PATENT DOCUMENTS

JP    U3067794    1/2000

(Continued)

OTHER PUBLICATIONS

"Search Report of PCT application". issued on May 12, 2009, p. 1-p. 5.

*Primary Examiner* — Pierre M Vital
*Assistant Examiner* — Augustine Obisesan
(74) *Attorney, Agent, or Firm* — Jianq Chyun IP Office (57) ABSTRACT

A testing module including a designation information storing section that stores designation information designating an order of decoding fundamental patterns, a fundamental pattern storing section that stores the fundamental patterns, a plurality of pattern generating sections that each generate a test pattern to be supplied to a device under test, a plurality of position information storing sections that each store, in association with a corresponding pattern generating section, position information designating a read position from which the designation information is read from the designation information storing section, and an information transmission path shared by the pattern generating sections that transmits a part of the designation information from the designation information storing section to the designation information temporary storing section in each pattern generating section. Each pattern generating section decodes the fundamental patterns in an order designated by the partial designation information stored on the designation information temporary storing section.

8 Claims, 5 Drawing Sheets

U.S. PATENT DOCUMENTS

| | | | |
|---|---|---|---|
| 2006/0221731 A1* | 10/2006 | Kobatake | 365/200 |
| 2006/0236185 A1* | 10/2006 | Baker | 714/738 |
| 2007/0011543 A1* | 1/2007 | Yoshimura et al. | 714/738 |
| 2008/0040639 A1* | 2/2008 | Kang | 714/738 |
| 2008/0235550 A1* | 9/2008 | Yamada et al. | 714/738 |

FOREIGN PATENT DOCUMENTS

| | | |
|---|---|---|
| JP | U3067794 | 4/2000 |
| JP | 2002-189632 | 7/2002 |
| JP | 2005-141532 | 6/2005 |
| JP | 2005-249735 | 9/2005 |

\* cited by examiner

TESTING MODULE, TESTING APPARATUS AND TESTING METHOD

BACKGROUND

1. Technical Field

The present invention relates to a testing module, a testing apparatus and a testing method. More particularly, the present invention relates to a testing module, a testing apparatus and a testing method which suitably test a large number of relatively small-size semiconductor devices.

2. Related Art

Japanese Patent Application Publication No. 2005-249735 discloses a pattern generator and a testing apparatus which are capable of efficiently generating a continuous test pattern used for testing an electronic device. The pattern generator disclosed in the above publication first stores test data blocks onto a cache memory in an order designated by designation information, and then sequentially outputs the test data blocks stored on the cache memory as a test pattern. According to the above publication, a single controller controls a plurality of pattern generators, and the pattern generators under the control of the controller test a single independent electronic device. This means that the pattern generators controlled by the single controller receive a single piece of designation information and that each pattern generator may not be capable of generating a test pattern independently.

When the pattern generators configured in the above manner are utilized to test a relatively small-size electronic device, that is to say, an electronic device with a small number of test target terminals, the number of the pattern generators controlled by the single controller may sometimes be larger than the number of the test target terminals. In other words, one or more redundant pattern generators may not be connected to the test target terminals to be tested and thus not used, which may in turn lower the overall testing efficiency of the testing apparatus.

SUMMARY

Therefore, it is an object of an aspect of the innovations herein to provide a testing apparatus and a testing method which are capable of overcoming the above drawbacks accompanying the related art. The above and other objects can be achieved by combinations described in the independent claims. The dependent claims define further advantageous and exemplary combinations of the innovations herein.

According to the first aspect related to the innovations herein, one exemplary testing module may include a testing module including a designation information storing section that stores thereon designation information designating an order of decoding fundamental patterns, a fundamental pattern storing section that stores thereon the fundamental patterns in a data form, a plurality of pattern generating sections each of which has a designation information temporary storing section that temporarily stores thereon part of the designation information, where each pattern generating section generates a test pattern to be supplied to a device under test by decoding the fundamental patterns in an order designated by the partial designation information stored on the designation information temporary storing section, a plurality of position information storing sections each of which stores thereon, in association with a corresponding one of the plurality of pattern generating sections, position information designating a read position from which the designation information is read from the designation information storing section, and an information transmission path that is shared by the plurality of pattern generating sections, where the information transmission path transmits the partial designation information from the designation information storing section to the designation information temporary storing section in each pattern generating section.

Here, each pattern generating section may independently generate the test pattern to be supplied to the device under test of the same type. The testing module may further include a plurality of designation information control sections that are provided in a one-to-one correspondence with the plurality of pattern generating sections. Here, each designation information control section (i) reads the part of the designation information stored on the designation information storing section from the read position designated by the position information stored on a corresponding one of the plurality of position information storing sections and (ii) stores the read partial designation information onto the designation information temporary storing section in a corresponding one of the plurality of pattern generating sections. The testing module may further include an arbitrating section that arbitrates read requests generated by the plurality of designation information control sections to read the part of the designation information from the designation information storing section.

The testing module may further include a plurality of detecting and comparing sections that are provided in a one-to-one correspondence with the plurality of pattern generating sections, where each detecting and comparing section (i) compares an output pattern that is actually output from the device under test in response to the supplied test pattern with an expected value pattern that is expected to be output from the device under test in response to the supplied test pattern and (ii) detects a failure when the output pattern does not match the expected value pattern, and a plurality of result storing sections that are provided in a one-to-one correspondence with the plurality of pattern generating sections, where each result storing section stores thereon failure information indicating a detail of a failure detected by a corresponding one of the plurality of detecting and comparing sections. Each result storing section may store thereon the failure information in association with a fundamental pattern from which the failure is caused.

According to the second aspect related to the innovations herein, one exemplary testing apparatus may include a testing apparatus including a designation information storing section that stores thereon designation information designating an order of decoding fundamental patterns, a fundamental pattern storing section that stores thereon the fundamental patterns in a data form, a plurality of pattern generating sections each of which has a designation information temporary storing section that temporarily stores thereon part of the designation information, where each pattern generating section generates a test pattern to be supplied to a device under test by decoding the fundamental patterns in an order designated by the partial designation information stored on the designation information temporary storing section, a plurality of position information storing sections each of which stores thereon, in association with a corresponding one of the plurality of pattern generating sections, where position information designates a read position from which the designation information is read from the designation information storing section, and an information transmission path that is shared by the plurality of pattern generating sections, where the information transmission path transmits the partial designation information from the designation information storing section to the designation information temporary storing section in each pattern generating section.

According to the third aspect related to the innovations herein, one exemplary testing method may include a testing method including storing fundamental patterns in a data form, storing designation information designating an order of decoding the fundamental patterns, storing, in association with each of a plurality of pattern generating sections, position information designating a read position from which the designation information is read, temporarily storing part of the designation information, through an information transmission path that is shared by the plurality of pattern generating sections, in association with each of the plurality of pattern generating sections, and generating a test pattern to be supplied to a device under test in association with each of the plurality of pattern generating sections by decoding the fundamental patterns in an order designated by the partial designation information stored in the temporarily storing.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENT

Some aspects of the invention will now be described based on an embodiment, which does not intend to limit the scope of the present invention, but exemplifies the invention. All of the features and the combinations thereof described in the embodiment are not necessarily essential to the invention.

Figure 1:
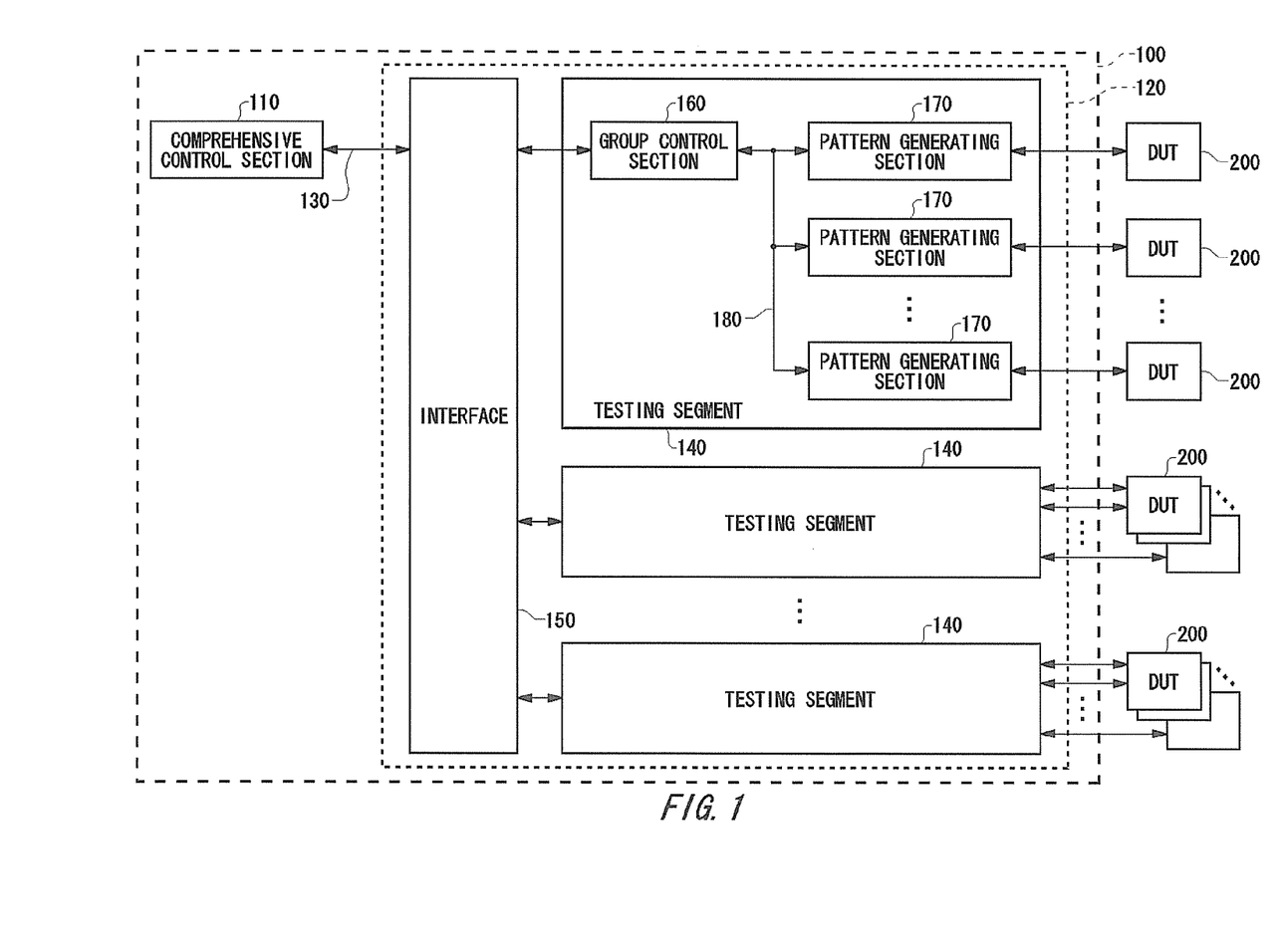
FIG. 1 is an exemplary functional block diagram illustrating a testing apparatus 100 relating to an embodiment of the present invention, together with devices under test (DUTs) 200.

FIG. 1 is an exemplary functional block diagram illustrating a testing apparatus 100 relating to an embodiment of the present invention, together with devices under test (DUTs) 200. The testing apparatus 100 includes a comprehensive control section 110, a testing module 120, and a standard bus 130. The testing module 120 includes a plurality of testing segments 140 and an interface 150. Each testing segment 140 includes a group control section 160, pattern generating sections 170, and an internal bus 180.

The comprehensive control section 110 transmits/receives data via the standard bus 130, to control the testing module 120. The comprehensive control section 110 may be an information processing apparatus such as a computer, which operates in accordance with programmed software. When the comprehensive control section 110 operates in accordance with software, a testing procedure can be programmed.

The testing module 120 tests the DUTs 200, under the control of the comprehensive control section 110. The testing module 120 may be designed so as to realize functionality corresponding to the type of the DUTs 200. For example, when the DUTs 200 are logic circuits, dynamic random access memories (DRAMs), electrically erasable programmable read only memories (EEPROMs) or analog circuits, the testing module 120 may be specially designed for the use with the logic circuits, DRAMs, EEPROMs or analog circuits. Here, FIG. 1 shows only one testing module 120, but the testing apparatus 100 may include a plurality of testing modules 120. Additionally, testing modules 120 having different functions may be connected to the standard bus 130, provided that the testing modules 120 communicate data in a manner compatible with the standard bus 130 and are controlled by the comprehensive control section 110.

The standard bus 130 transmits control data output from the comprehensive control section 110 to the testing module 120. Also, the standard bus 130 transmits test data obtained by the testing module 120 to the comprehensive control section 110. As mentioned earlier, it is possible to connect a plurality of testing modules 120 having different functions to the standard bus 130. Such testing modules 120 can have any combination of different functions, provided that the testing modules 120 are compatible with the standard bus 130. The testing modules 120 having any combination of different functions can interface to the standard bus 130 compliant with a certain protocol.

Each testing segment 140 defines a group of pattern generating sections 170 that are controlled by a single group control section 160. The number of pattern generating sections 170 included in each testing segment 140 can be selected such that the testing segment 140 can appropriately test one or more DUTs 200. Note that the pattern generating sections 170 included in each testing segment 140 generate the same pattern sequence.

The interface 150 interfaces the data transfer between the testing segments 140 and the comprehensive control section 110. The interface 150 complies with the protocol that is followed by the standard bus 130.

Each testing segment 140 includes one group control section 160. The group control section 160 controls the pattern generating sections 170 included in the corresponding testing segment 140. The group control section 160 communicates with the comprehensive control section 110 via the interface 150. The group control section 160 is controlled by the comprehensive control section 110. Under the control of the comprehensive control section 110, the group control section 160 controls not only the corresponding pattern generating sections 170 but also the corresponding testing segment 140 as a whole.

The pattern generating sections 170 generate test patterns to be supplied to the DUTs 200. Here, each testing segment 140 includes a plurality of pattern generating sections 170. Which is to say, one group control section 160 controls a plurality of pattern generating sections 170.

The internal bus 180 transmits data from the group control section 160 to the pattern generating sections 170 in each testing segment 140. The internal bus 180 may be shown as an example of an information transmission path shared by the pattern generating sections 170. The representative examples of the data transmitted through the internal bus 180 can include data indicating fundamental patterns from which the test patterns are to be generated, or designation information designating the order of decoding the fundamental patterns.

Figure 2:
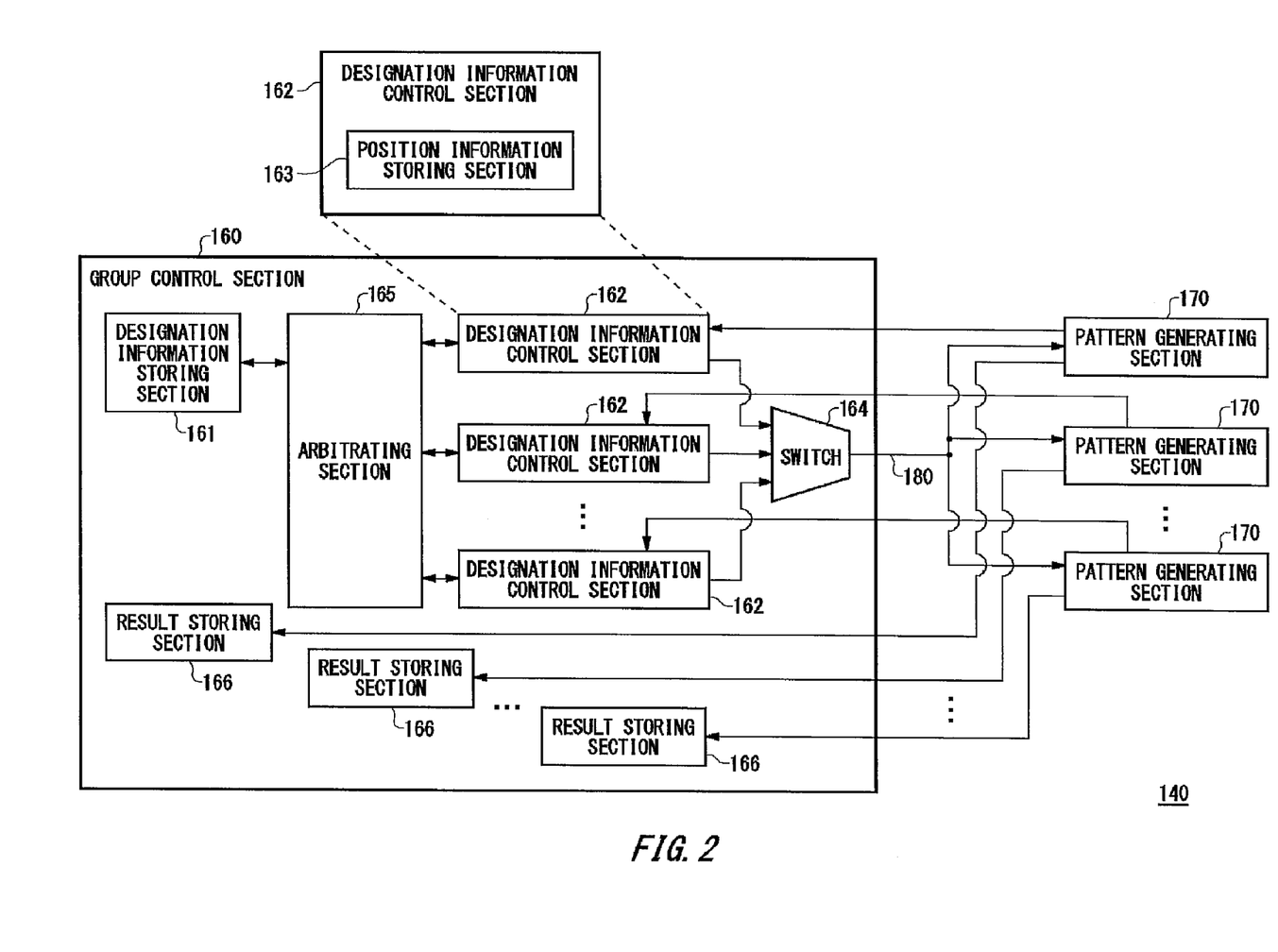
FIG. 2 is an exemplary functional block diagram illustrating a testing segment 140.

FIG. 2 is an exemplary functional block diagram illustrating each testing segment 140. In particular, FIG. 2 illustrates the exemplary functions of the group control section 160 in detail. The group control section 160 includes a designation information storing section 161, designation information control sections 162, a switch 164, an arbitrating section 165, and result storing sections 166. Each designation information control section 162 includes a position information storing section 163.

Figure 3:
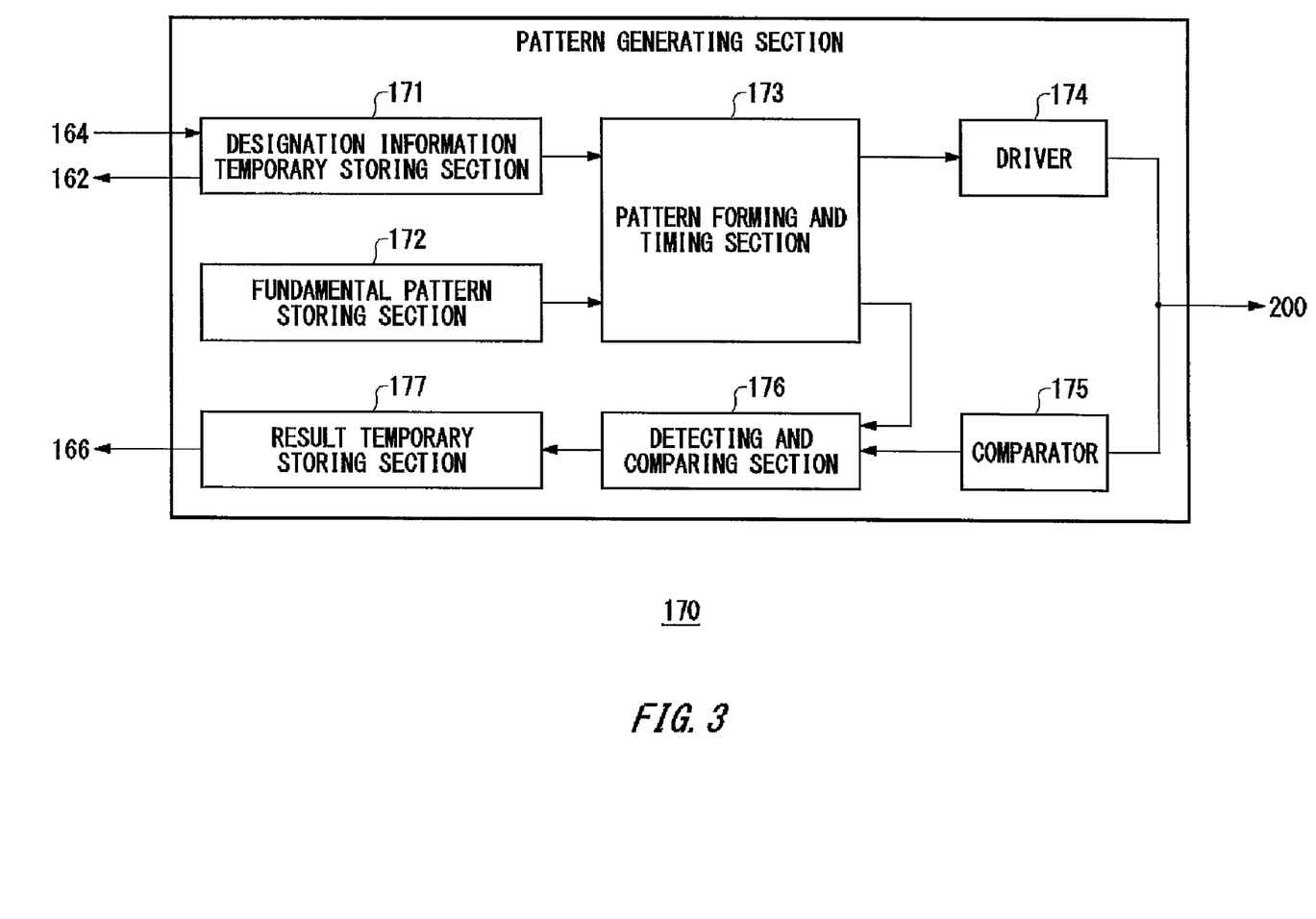
FIG. 3 is an exemplary functional block diagram illustrating a pattern generating section 170.

FIG. 3 is an exemplary functional block diagram illustrating each pattern generating section 170. Each pattern generating section 170 includes a designation information temporary storing section 171, a fundamental pattern storing section 172, a pattern forming and timing section 173, a driver 174, a comparator 175, a detecting and comparing section 176, and a result temporary storing section 177.

The fundamental pattern storing section 172 stores fundamental patterns in the data form. Each fundamental pattern may be the unit of a test pattern. Each pattern generating section 170 can generate the test pattern by decoding test patterns to form a pattern sequence. Here, each pattern generating section 170 includes the fundamental pattern storing section 172. When a plurality of pattern generating sections 170 use the same set of fundamental patterns, however, a fundamental pattern storing section 172 may be separately provided from the pattern generating sections 170 so as to be shared by the pattern generating sections 170.

The designation information storing section 161 stores designation information designating the order of decoding the fundamental patterns. The designation information stored on the designation information storing section 161 may be a list of fundamental patterns. It is possible to generate a complex test pattern by decoding the fundamental patterns in the listed order. Since the designation information lists up the fundamental patterns in a given order, it is possible to decode the fundamental patterns continuously, thereby generating a continuous and unbroken test pattern.

The designation information temporary storing section 171 temporarily stores part of the designation information. The designation information temporary storing section 171 is included in each pattern generating section 170, and retains a list of fundamental patterns to be immediately decoded by the corresponding pattern generating section 170. The designation information temporary storing section 171 may be a first-in first-out (FIFO) buffer, but not limited to such. The designation information temporary storing section 171 may be a memory for which a recording position is identified by an address on a register. The designation information temporary storing section 171 may be a cache memory such as SRAM.

Each designation information control section 162 controls reading of the designation information. Each designation information control section 162 includes the position information storing section 163, and reads the designation information with reference to the position information stored on the position information storing section 163. Specifically speaking, each designation information control section 162 reads part of the designation information stored on the designation information storing section 161, from the read position designated by the position information stored on the corresponding position information storing section 163. Each designation information control section 162 stores the read partial designation information onto the corresponding designation information temporary storing section 171. Here, the designation information control sections 162 may be provided within the pattern generating sections 170 in a one-to-one-correspondence.

Each position information storing section 163 records the read position from which the designation information is read, for the corresponding pattern generating section 170, as described above. Specifically speaking, each position information storing section 163 independently stores the position information, in association with the corresponding one of the pattern generating sections 170, which designates the read position of the designation information stored on the designation information storing section 161 that is shared by the pattern generating sections 170.

The arbitrating section 165 arbitrates the read requests issued by the designation information control sections 162 to read part of the designation information from the designation information storing section 161. The switch 164 provides connection between each designation information control section 162 and the corresponding pattern generating section 170. In this manner, the switch 164 controls the data transmission through the internal bus 180. The switch 164 may be provided in the form of hardware, or may be realized as a switching function in the form of software.

The pattern forming and timing section 173 in each pattern generating section 170 generates a test pattern by decoding the fundamental patterns in the order designated by the designation information. The pattern forming and timing section also adjusts the timing of outputting the generated test pattern.

The driver 174 in each pattern generating section 170 outputs, as a signal to be supplied to one or more DUTs 200, the test pattern output from the pattern forming and timing section 173. The comparator 175 in each pattern generating section 170 compares a reference voltage with one or more signals that are output from one or more DUTs 200 in response to the input of the test pattern, to convert the output signal into a logic value.

In the present embodiment, the test apparatus 100 includes the internal bus 180 in each testing segment 140 as stated earlier, and the internal bus 180 transfers a variety of data as stated earlier. Most importantly, the internal bus 180 transmits part of the designation information from the designation information storing section 161 to each designation information temporary storing section 171. As described earlier, the pattern forming and timing section 173 in each pattern generating section 170 generates a test pattern by decoding the fundamental patterns stored on the fundamental pattern storing section 172 and outputs the generated test pattern. Here, the pattern forming and timing section 173 operates at a very high frequency, which is attributed to the enhanced performance of the test targets, that is to say, the DUTs 200.

In order that the pattern forming and timing section 173 generates a continuous and unbroken test pattern, the designation information designating the fundamental patterns is required to be swiftly transmitted to each designation information temporary storing section 171. In the testing apparatus 100 relating to the present embodiment, this transmission is carried out via the internal bus 180. Therefore, the designation information can be swiftly transmitted from the designation information storing section 161 to each designation information temporary storing section 171. In addition, the internal bus 180 increases the versatility of the testing apparatus 100, and can thus easily deals with an increase in the number of pattern generating sections 170 in each testing segment 140. Furthermore, since the internal bus 180 can transmit a variety of types of data, the present embodiment can reduce the wirings.

The detecting and comparing section 176 compares the output from the comparator 175 with an expected value. To be more specific, the detecting and comparing section 176 compares the output pattern that is actually output from one or more DUTs 200 in response to the supplied test pattern, with an expected value pattern that is expected to be output from one or more DUTs 200 in response to the supplied test pattern. When the output pattern does not match the expected value pattern, the detecting and comparing section 176 detects a failure. The result temporary storing section 177 temporarily stores the comparison result produced by the detecting and comparing section 176.

Each result storing section 166 stores failure information indicating the details of the failure detected by the corresponding detecting and comparing section 176. The result storing sections 166 are provided in a one-to-one correspondence with the pattern generating sections 170. With such a configuration, even when one independent DUT 200 is associated with each pattern generating section 170, the test result of each DUT 200 can be independently stored or read. Here, the test results may be transmitted from the pattern generating sections 170 to the result storing sections 166 by using the internal bus 180.

As described above, the internal bus 180 can be used to transmit a variety of types of data, most importantly, the designation information between the group control section 160 and the corresponding pattern generating sections 170. Therefore, the pattern generating sections 170 can generate continuous test patterns. The highly versatile internal bus 180 can easily deal with an increase in the number of pattern generating sections 170 in each testing segment 140. Additionally, the internal bus 180 can reduce the specialized wirings, thereby curtailing the number of wirings.

Figure 4:
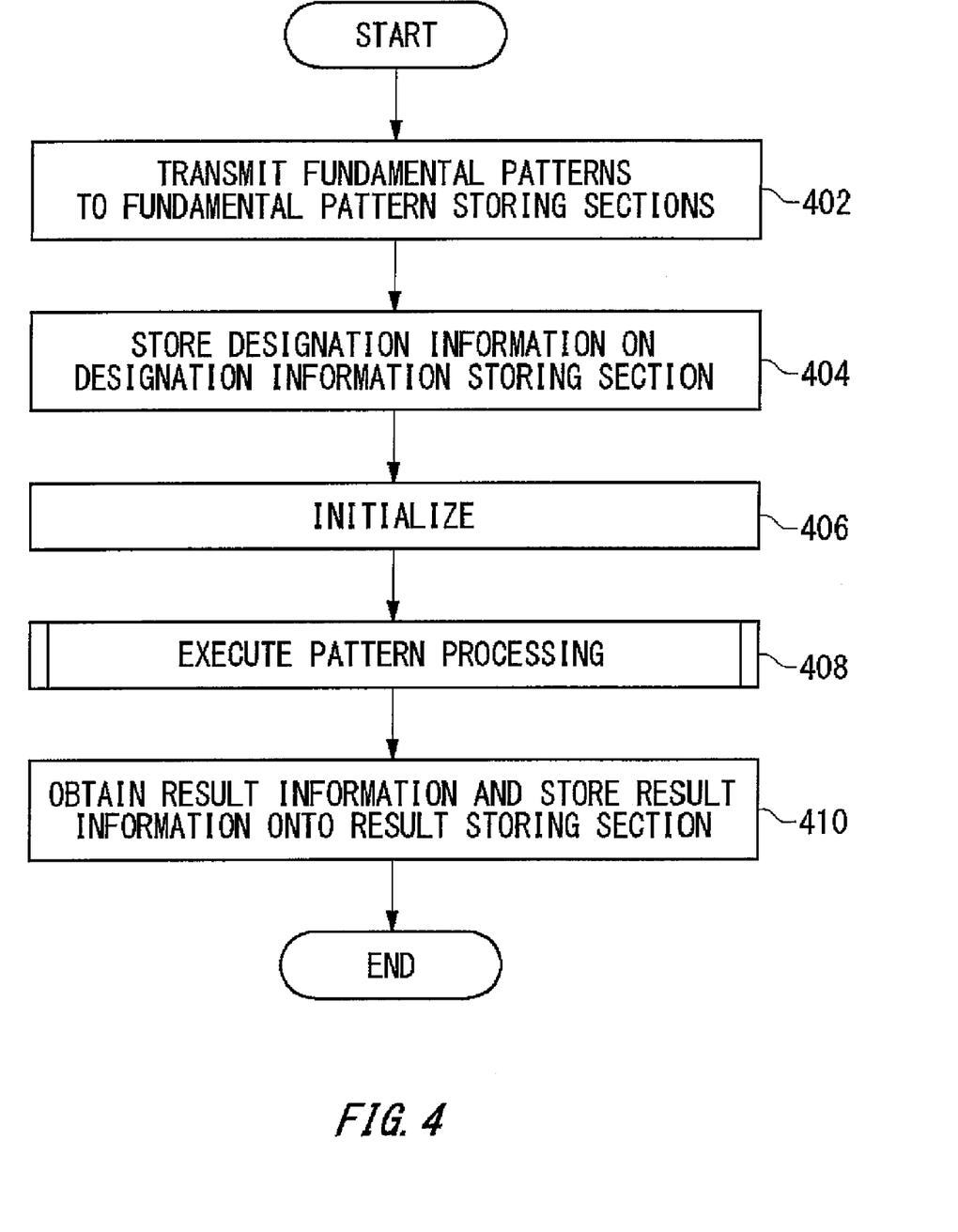
FIG. 4 is an exemplary flow chart illustrating a test conducted by the testing apparatus 100 relating to the present embodiment.

FIG. 4 is an exemplary flow chart illustrating a test performed by using the testing apparatus 100 relating to the present embodiment. At the start of the test, the testing apparatus 100 stores the fundamental patterns in the data form onto the fundamental pattern storing sections 172 (step 402). Subsequently, the testing apparatus 100 stores the designation information onto the designation information storing section 161 (step 404). After this, the testing apparatus 100 initializes the pattern generating sections 170 and the like (step 406).

Following the initialization, the testing apparatus 100 executes pattern processing (step 408). On completion of the pattern processing, the testing apparatus 100 obtains result information, and stores the result information onto the result storing sections 166 (step 410). Here, the testing apparatus 100 ends the test. After the end of the test, the testing apparatus 100 can read desired test results from the result storing sections 166 in order to confirm or analyze the test results.

Figure 5:
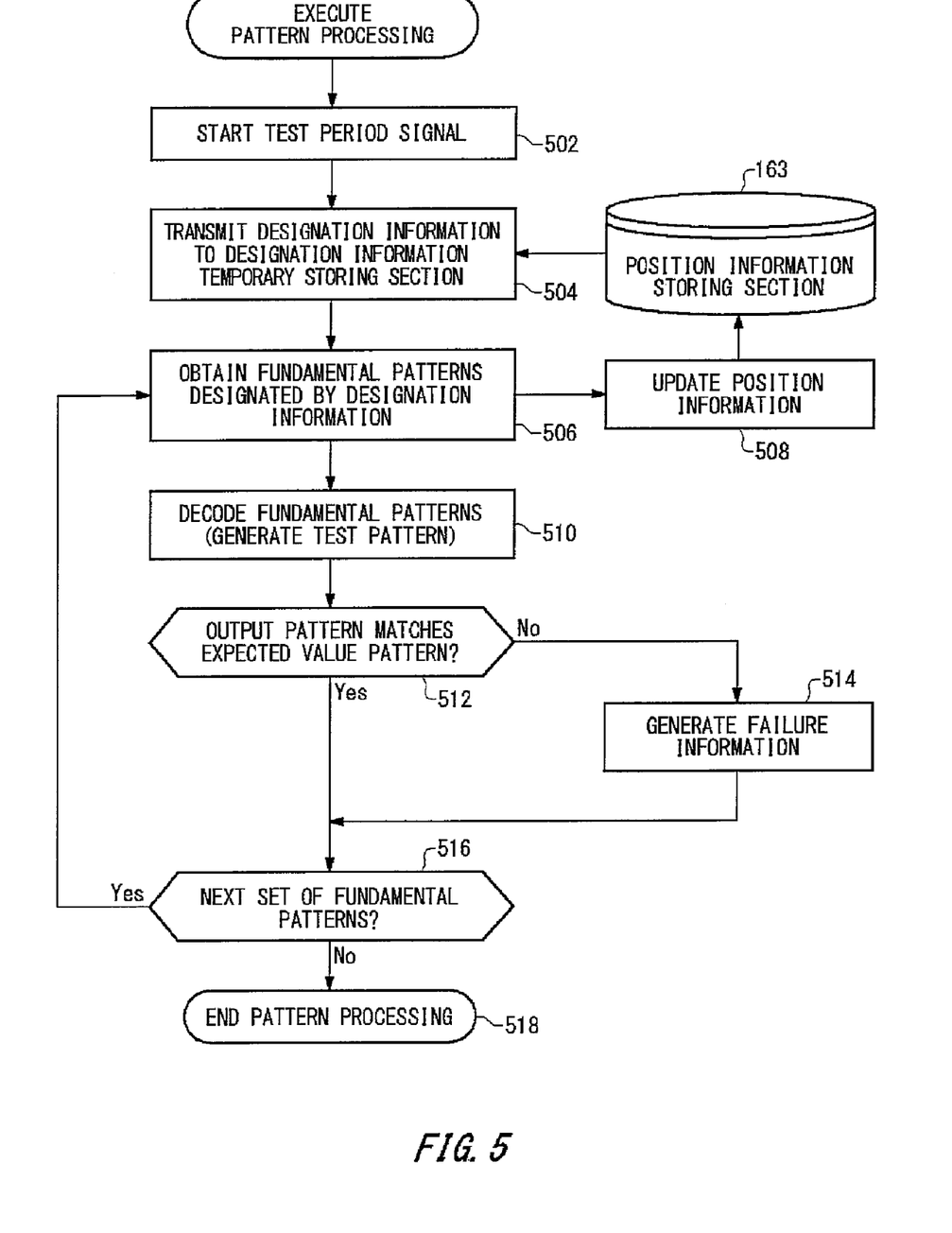
FIG. 5 is an exemplary flow chart illustrating how to execute pattern processing.

FIG. 5 is an exemplary flow chart illustrating how to execute the pattern processing. At the start of the pattern processing, the testing apparatus 100 starts the application of a test period signal (step 502), and the group control section 160 transmits the designation information to the designation information temporary storing sections 171 (step 504). This transmission of the designation information is performed with reference to the position information stored on the position information storing sections 163. Note that the testing apparatus 100 can transmit the designation information to the designation information temporary storing sections 171 whenever the designation information temporary storing sections 171 have free storage regions. The testing apparatus 100 can carry out the transmission of the designation information independently from the procedure including the step 506 and the subsequent steps.

After the step 504, each pattern generating section 170 obtains fundamental patterns that are designated by the designation information (step 506). Once the pattern generating section 170 obtains the fundamental patterns, the pattern generating section 170 no longer needs the corresponding designation information. Therefore, the pattern generating section 170 updates the position information (step 508).

Subsequently, the pattern generating section 170 decodes the obtained fundamental patterns (step 510). The pattern generating section 170 decodes the fundamental patterns in the following manner, for example. The circuit may be configured such that a pattern sequence formed by the fundamental patterns is retained as the fundamental patterns and that the pattern sequence is output as the test pattern when the fundamental patterns are written into, for example, a cache memory. An alternative method is explained in the following. A data table is retained which associates a predetermined pattern sequence and identification information identifying the predetermined pattern sequence with each other, and identification information can be described in the data indicating the fundamental patterns. When this method is used, the circuit realizing can be configured in such a manner that, when identification information is recognized, a pattern sequence associated with the recognized identification information is written into, for example, a cache memory, and that the pattern sequence is output as the test pattern.

The pattern generating section 170 inputs the output test pattern into one or more DUTs 200, and judges whether the patterns output from the DUTs 200 match an expected value pattern (step 512). When the output patterns do not match the expected value pattern (NO: step 512), the pattern generating section 170 generates failure information (step 514). When the output patterns match the expected value pattern (YES: step 512), the pattern generating section 170 proceeds to the step of judging whether there is a next set of fundamental patterns.

The pattern generating section 170 judges whether there is data indicating a next set of fundamental patterns (step 516). When there is data indicating a next set of fundamental patterns (YES: step 516), the pattern generating section 170 goes back to the step 506 and performs the subsequent steps. When there is no data indicating a next set of fundamental patterns (NO: step 516), the pattern generating section 170 ends the pattern processing (step 518).

The testing apparatus 100 described above can use the internal bus 180 to effectively transmit test data to a large number of pattern generating sections 170. When controlling each pattern generating section 170 at an independent timing from the remaining pattern generating sections 170, the testing apparatus 100 is required to transmit designation information to each pattern generating section 170 separately. The internal bus 180 is suitably used for such transmission, since the internal bus 180 can achieve a predetermined transmission rate with a small number of wirings.

When an independent DUT 200 is associated with each pattern generating section 170, each pattern generating section 170 is required to conduct a test at an independent timing. Such a requirement can be satisfied by using the internal bus 180. Here, by associating an independent DUT 200 with each pattern generating section 170, it is possible to reduce the number of pattern generating sections 170 that are not being used. This can increase the utilization efficiency of the testing apparatus 100. In particular, the testing apparatus 100 relating to the present embodiment can be effectively employed for relatively small-sized DUTs 200 each having a small number of test terminals.

In the above description, the DUTs 200 are associated with the pattern generating sections 170 in a one-to-one correspondence. Alternatively, two or more pattern generating sections 170 may test an independent DUT 200. As another alternative example, the pattern generating sections 170 controlled by a given group control section 160 may be combined with the pattern generating sections 170 controlled by a different group control section 160 to test a single DUT 200. In other words, each DUT 200 may be tested by a group of pattern generating sections 170 defined by a single testing segment 140, or by groups of pattern generating sections 170 defined by two or more testing segments 140. In any of the abovementioned cases, the testing apparatus 100 relating to the present embodiment can independently control each pattern generating section 170, thereby conducting tests appropriately.

Although some aspects of the present invention have been described by way of the exemplary embodiment, it should be understood that those skilled in the art might make many changes and substitutions without departing from the spirit and the scope of the present invention which is defined only by the appended claims.

As is apparent from the above description, a testing module, a testing apparatus and a testing method relating to an embodiment of the present invention realize highly efficient use of the pattern generating sections 170.

What is claimed is:

1. A testing module for use in a testing apparatus, the testing module comprising:
    a designation information storing section that stores thereon designation information designating an order of decoding fundamental patterns;
    a fundamental pattern storing section that stores thereon the fundamental patterns in a data form;
    a plurality of pattern generating sections each of which includes one or more memories and generates a test pattern to be supplied to a device under test;
    a plurality of position information storing sections each of which stores thereon, in association with a corresponding one of the plurality of pattern generating sections, position information designating a read position from which the designation information is read from the designation information storing section; and
    an information transmission path that is shared by the plurality of pattern generating sections, the information transmission path transmitting a part of the designation information from the designation information storing section to a designation information temporary storing section in each pattern generating section, wherein
    each of the plurality of pattern generating sections decodes the fundamental patterns in an order designated by the partial designation information stored on the designation information temporary storing section.

2. The testing module as set forth in claim 1, wherein each pattern generating section generates the test pattern to be supplied to the same type of device under test.

3. The testing module as set forth in claim 2, further comprising a plurality of designation information control sections that are provided in a one-to-one correspondence with the plurality of pattern generating sections, each designation information control section (i) reading the part of the designation information stored on the designation information storing section from the read position designated by the position information stored on a corresponding one of the plurality of position information storing sections and (ii) storing the read partial designation information onto the designation information temporary storing section in a corresponding one of the plurality of pattern generating sections.

4. The testing module as set forth in claim 3, further comprising an arbitrating section that arbitrates read requests generated by the plurality of designation information control sections to read the part of the designation information from the designation information storing section.

5. The testing module as set forth in claim 4, further comprising:
    a plurality of detecting and comparing sections that are provided in a one-to-one correspondence with the plurality of pattern generating sections, each detecting and comparing section (i) comparing an output pattern that is actually output from the device under test in response to the supplied test pattern with an expected value pattern that is expected to be output from the device under test in response to the supplied test pattern and (ii) detecting a failure when the output pattern does not match the expected value pattern; and
    a plurality of result storing sections that are provided in a one-to-one correspondence with the plurality of pattern generating sections, each result storing section storing thereon failure information indicating a detail of a failure detected by a corresponding one of the plurality of detecting and comparing sections.

6. The testing module as set forth in claim 5, wherein each result storing section stores thereon the failure information in association with a fundamental pattern from which the failure is caused.

7. A testing apparatus comprising:
    a designation information storing section that stores thereon designation information designating an order of decoding fundamental patterns;
    a fundamental pattern storing section that stores thereon the fundamental patterns in a data form;
    a plurality of pattern generating sections each of which includes one or more memories and generates a test pattern to be supplied to a device under test;
    a plurality of position information storing sections each of which stores thereon, in association with a corresponding one of the plurality of pattern generating sections, position information designating a read position from which the designation information is read from the designation information storing section; and
    an information transmission path that is shared by the plurality of pattern generating sections, the information transmission path transmitting part of the designation information from the designation information storing section to a designation information temporary storing section in each pattern generating section, wherein
    each of the plurality of pattern generating sections decodes the fundamental patterns in an order designated by the partial designation information stored on the designation information temporary storing section.

8. A testing method performed by a testing apparatus, the testing method comprising:
    storing fundamental patterns in a data form;
    storing designation information designating an order of decoding the fundamental patterns;
    storing, in association with each of a plurality of pattern generating sections, position information designating a read position from which the designation information is read;
    transmitting, through an information transmission path that is shared by the plurality of pattern generating sections, part of the designation information to each of the plurality of pattern generating sections;
    temporarily storing the partial designation information in each of the plurality of pattern generating sections;
    decoding, by each of the plurality of pattern generating sections, the fundamental patterns in an order designated by the partial designation information temporarily stored in the pattern generating section; and
    generating, by each of the plurality of pattern generating sections, a test pattern to be supplied to a device under test.

* * * * *